United States Patent
Dantz et al.

(10) Patent No.: US 7,491,966 B2
(45) Date of Patent: *Feb. 17, 2009

(54) SEMICONDUCTOR SUBSTRATE AND PROCESS FOR PRODUCING IT

(75) Inventors: Dirk Dantz, Sassenburg (DE); Andreas Huber, Garching (DE); Reinhold Wahlich, Tittmoning (DE); Brian Murphy, Pfarrkirchen (DE)

(73) Assignee: Siltronic AG, Munich (DE)

( * ) Notice: Subject to any disclaimer, the term of this patent is extended or adjusted under 35 U.S.C. 154(b) by 222 days.

This patent is subject to a terminal disclaimer.

(21) Appl. No.: 11/157,260

(22) Filed: Jun. 21, 2005

(65) Prior Publication Data

US 2005/0287767 A1 Dec. 29, 2005

(30) Foreign Application Priority Data

Jun. 24, 2004 (DE) ........................ 10 2004 030 612

(51) Int. Cl.
*H01L 29/06* (2006.01)
(52) U.S. Cl. .................... 257/19; 257/18; 257/E29.193
(58) Field of Classification Search ................. 257/347, 257/18, 19, E29.193; 438/311, 464
See application file for complete search history.

(56) References Cited

U.S. PATENT DOCUMENTS 6,136,684 A * 10/2000 Sato et al. ................... 438/624

2006/0097317 A1* 5/2006 Dantz et al. .................. 257/347

FOREIGN PATENT DOCUMENTS

| DE | 10131 249 A1 | 5/2002 |
|---|---|---|
| EP | 553 852 B1 | 8/2003 |
| EP | 1 427 010 A1 | 6/2004 |
| WO | WO 03/003 430 A2 | 1/2003 |

* cited by examiner

*Primary Examiner*—Quoc D Hoang
(74) *Attorney, Agent, or Firm*—Brooks Kushman P.C.

(57) ABSTRACT

A process for producing a semiconductor substrate comprising a carrier wafer and a layer of single-crystalline semiconductor material:
  a) producing a layer containing recesses at the surface of a donor wafer of single-crystalline semiconductor material,
  b) joining the surface of the donor wafer containing recesses to the carrier wafer,
  c) heat treating to close the recesses at the interface between the carrier wafer and the donor wafer to form a layer of cavities within the donor wafer, and
  d) splitting the donor wafer along the layer of cavities, resulting in a layer of semiconductor material on the carrier wafer. Semiconductor substrates prepared thusly may have a single-crystalline semiconductor layer having a thickness of 100 nm or less, a layer thickness uniformity of 5% or less, and an HF defect density of $0.02/cm^2$ or less.

8 Claims, 2 Drawing Sheets

SEMICONDUCTOR SUBSTRATE AND PROCESS FOR PRODUCING IT

BACKGROUND OF THE INVENTION

1. Field of the Invention

The invention relates to a semiconductor substrate, comprising a carrier wafer and a layer of single-crystal semiconductor material, to a process for producing the semiconductor substrate, and to an intermediate product formed in the process.

2. Background Art

Wafers comprising a thin layer of semiconductor material on an electrically insulating substrate have been disclosed as preliminary products for the fabrication of electronic components. In an alternative configuration, the thin semiconductor layer may be separated from a substrate which likewise consists of semiconductor material, by an electrically insulating layer. If the semiconductor material of the thin layer is silicon, the wafers are known as SOI (silicon on insulator) wafers.

A number of processes for producing wafers of this type are also known. In most of the known processes, a separating layer, for example a layer with cavities, is produced just below the surface of a semiconductor wafer (known as the donor wafer). The donor wafer which has been prepared in this manner is joined to a second wafer, the carrier wafer. Then, the donor wafer is split along the separating layer, transferring a layer of the donor wafer to the carrier wafer.

WO03/003430A2 describes one process in which a thin layer of semiconductor material is transferred from a donor wafer to a carrier wafer. First, patterns of periodically recurring recesses of predetermined geometries are produced on that side of the donor wafer which is intended for the transfer. These recesses are then closed up at the surface of the donor wafer by a heat treatment, so as to form a layer with periodically recurring cavities beneath a continuous layer at the surface of the material. The donor wafer which has been prepared in this manner is joined to a carrier wafer. Then, the donor wafer is split along the layer containing the cavities, for example by further heat treatment.

The aforementioned process comprises a large number of steps and is therefore relatively complex. Furthermore, the process does not allow layers to be transferred which are as thin as desired, since the thickness of the layer is limited by the lithography used to produce the recesses. To obtain very thin layers, for example those with a thickness of less than 10 nm, it is necessary for a thicker layer, such as one with a thickness of 50 nm, first to be transferred to the carrier wafer, followed by reducing the layer thickness by suitable measures as described in WO03/003430 A2.

By way of example, it is possible for a layer with a mean thickness of 100 nm and a standard deviation of 5%, based on the mean layer thickness, to be transferred. This means that up to 32% of the surface area deviates by 5% (i.e. 5 nm) or more and even 0.3% of the surface area even deviates by 15% (i.e. 15 nm) or more from the mean layer thickness. If the thickness of the transferred layer is then reduced to 15 nm, the standard deviation of 5% which is present after transfer and separation leads to the transferred layer of semiconductor material being completely removed in statistical terms over approximately 0.15% of the surface area. In the case of a wafer with a diameter of 300 mm and a surface area of 707 cm$^2$, therefore, the layer of semiconductor material is completely removed over a surface area of approximately 1 cm$^2$. These regions are detectable as HF defects. If the thickness of a transferred semiconductor layer is excessively reduced in the manner described, the layer thickness homogeneity which is present after the transfer and separation has a direct effect on the HF defect density after the thickness reduction. In addition, the conventional processes used for thickness reduction tend to have an adverse effect on the absolute layer thickness homogeneity, and consequently at very low final thicknesses the HF defect density rises still further.

SUMMARY OF THE INVENTION

It is an object of the invention to provide a layered structure having an ultra-thin semiconductor layer and at the same time a very low HF defect density. This and other objects are met by the invention, wherein a recess-configured donor wafer is joined to a carrier wafer, following which the recesses are closed at the carrier wafer/donor wafer interface forming cavities within the donor wafer, and the donor wafer is then split along the plane of the cavities thus formed.

DETAILED DESCRIPTION OF THE PREFERRED EMBODIMENT(S)

The invention thus pertains to a process for producing a semiconductor substrate comprising a carrier wafer and a layer of single-crystal semiconductor material on a side of the carrier wafer, the process comprising the following steps, in the order given:

a) producing a layer containing recesses at the surface of a donor wafer of single-crystal semiconductor material, b) joining the layer of the donor wafer containing recesses to a carrier wafer, c) heat treating to close up recesses at the interface between the carrier wafer and the donor wafer, so as to form a layer of cavities within the donor wafer, and d) splitting the donor wafer along the layer of cavities, so that what remains is a layer consisting of the semiconductor material on the carrier wafer.

Figure 1:
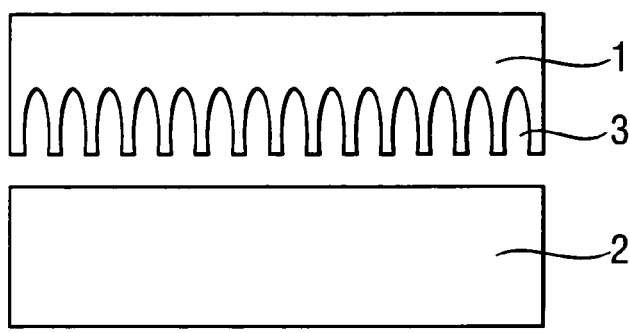
FIGS. 1-5 diagrammatically depict the transfer according to the invention of a thin layer of a semiconductor material from a donor wafer to a carrier wafer.
Figure 6:
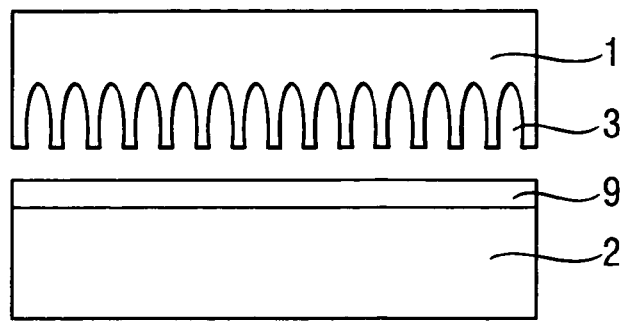
FIGS. 6-10 diagrammatically depict the transfer according to the invention of a thin layer of a semiconductor material from a donor wafer to a carrier wafer, with the carrier wafer on one surface carrying an additional layer, to which the recess-containing layer of the donor wafer is joined.
Figure 7:
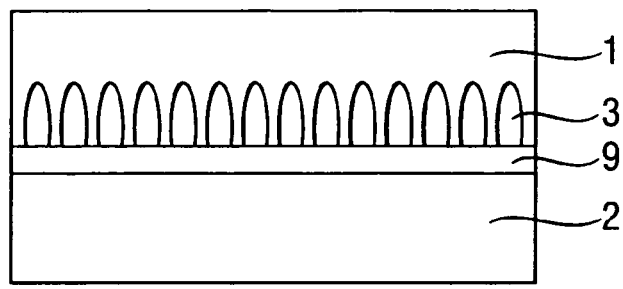
Figure 8:
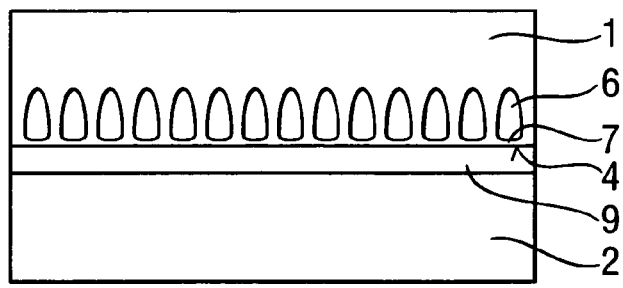
Figure 9:
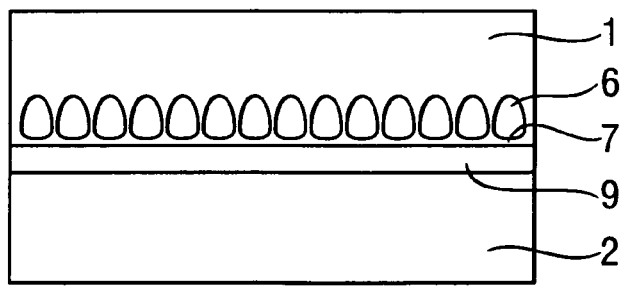
Figure 10:
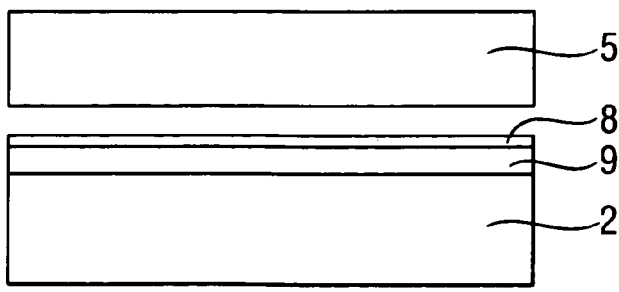

According to the invention, first of all in step a) (FIGS. 1 and 6), the donor wafer 1 consisting of the desired semiconductor material is prepared by creating a layer which contains recesses 3 on one of its surfaces. The recesses 3 may be regular or irregular in form. They can be produced, for example, by lithography and trench etching (cf. for example WO03/003430A2) or by anodic etching (cf. for example EP553852B1).

Figure 2:
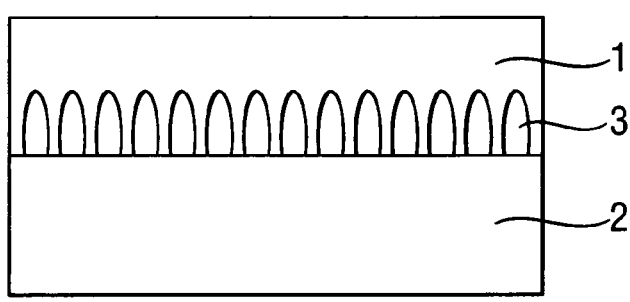
Figure 3:
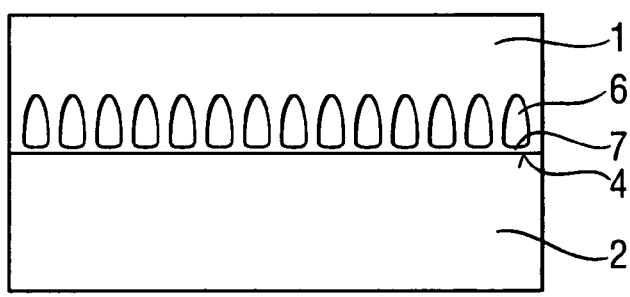
Figure 4:
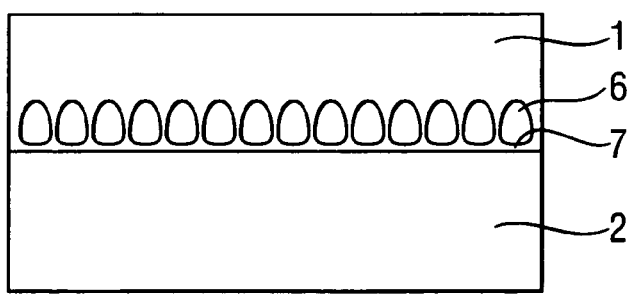

Then, in step b) (FIGS. 2 and 7), the donor wafer 1 is joined to a carrier wafer 2 in such a manner that the layer comprising recesses 3 is located between the two joined layers. In the process according to the invention, therefore, unlike in prior art, a layer which contains recesses 3 is directly joined to a carrier wafer 2. If the carrier wafer 2, as illustrated in FIGS. 6-10, bears an additional layer 9, the donor wafer 1 is joined to the additional layer 9. If the carrier wafer 2 is a semiconductor wafer, the additional layer 9 may, for example, be an insulating layer, for example an oxide of the semiconductor material. In this case, an SOI wafer can be produced if the donor wafer 1 is a silicon wafer.

In step c) (FIGS. 3,4 and 8,9), the joined wafers are heat-treated at a suitable temperature. The temperature depends on the material of which the donor wafer 1 consists. The temperature must be sufficiently high to ensure sufficient mobility of the atoms of the donor wafer 1 at the interface 4. If the donor wafer 1 consists of silicon, the heat treatment preferably takes place at a temperature in the range between 500° C. and the melting point of silicon. A heat treatment of between 900° C. and 1100° C. is particularly preferred. The heat treatment may, for example, be carried out under a hydrogen-containing atmosphere. If necessary, the heat treatment may be used to strengthen the joining force at the interface 4 between the joined wafers. Primarily, however, the recesses 3 at the interface 4 between the donor wafer 1 and the carrier wafer 2 are closed up by surface diffusion of the atoms of the semiconductor material, so as to form closed cavities 6 which are located completely within the donor wafer 1 and no longer directly adjoin the carrier wafer 2 or the additional layer 9 of the carrier wafer 2. On account of the surface diffusion brought about by the heat treatment, the recesses 3 begin to narrow in the region of the interface 4 before finally being closed up to form cavities 6. The shape of the recesses 3 or cavities 6 remains virtually identical during this step. Therefore, during the heat treatment a continuous layer 7 consisting of the semiconductor material of the donor wafer 1 is formed at the interface 4.

After heat treatment, the joined wafers have the following structure: the carrier wafer 2 (or the additional layer 9) is followed by a thin, continuous, single-crystalline layer 7 of the semiconductor material, which in turn is followed by the residual layer comprising cavities 6, and then the remainder 5 of the donor wafer.

Figure 5:
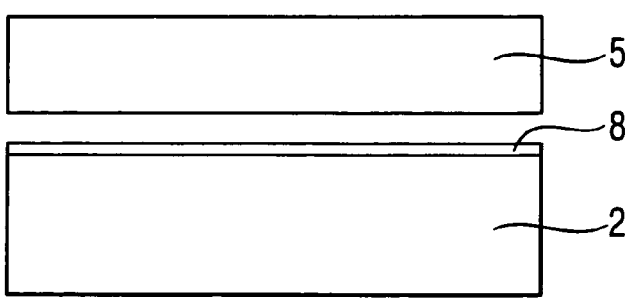

Then, in step d) (FIGS. 5 and 10), this structure is split along the residual layer comprising cavities 6, so that all that remains is a thin layer 8 of the semiconductor material on the carrier wafer 2. The splitting can be carried out under the action of a mechanical force, for example by using a gas jet, a liquid jet, a wedge, by flexural loading or other suitable measures, which can also be used in combination.

However, it is preferable for the splitting step to be implemented by means of further heat treatment. Immediately after the surface has been closed up in step c), i.e. as soon as a continuous, thin layer 7 with a thickness of a few atomic layers has formed, the cavities 6, with a view to minimizing energy, begin to reduce their internal surface areas and therefore to seek to adopt a spherical shape. The widening of the cavities 6 causes the cavities to join up with one another and ultimately separate the thin single-crystalline layer 7, 8 from the remainder 5 of the donor wafer. The conditions for this further heat treatment preferably correspond to those used in step c), since the same surface diffusion mechanisms are utilized.

The invention also relates to a semiconductor substrate, comprising a carrier wafer 2 and a donor wafer 1 of single-crystalline semiconductor material, wherein the donor wafer 1 is joined to the carrier wafer 2 via a layer containing recesses 3 at its surface. This semiconductor substrate is formed as an intermediate product in step b) of the process according to the invention, i.e. when the layer of the donor wafer 1 containing recesses 3 is being joined to the carrier wafer 2. It comprises a sequence of a plurality of layers and is distinguished by a preferably planar, inner interface 4, along which there is a layer comprising closed cavities. These cavities are arranged in such a way that on one side they are in contact with the inner interface 4, and therefore the walls of the cavities consist of the two materials which are separated by the interface 4.

The invention also relates to a semiconductor substrate, comprising a carrier wafer 2 and a layer 8 consisting of single-crystal semiconductor material, wherein the layer 8 has a thickness of 100 nm or less, has a layer thickness uniformity of 5% or less and an HF defect density of $0.02/cm^2$ or less. In particular, the invention relates to a semiconductor substrate of this type which includes a layer 8 consisting of single-crystalline semiconductor material with a lower thickness, more specifically a thickness of 80 nm or less, preferably 50 nm or less, and most preferably 20 nm or less, as well as the properties listed previously. In this context, the expression "layer thickness uniformity" is equivalent to the 6σ value, i.e. six times the standard deviation.

The semiconductor substrates which are produced by the inventive process are distinguished by a very thin layer 8 of semiconductor material with a good layer thickness uniformity and a very low HF defect density. The maximum HF defect density of the semiconductor substrate according to the invention is only 20% of the value of $0.1/cm^2$ achieved in the process of WO03/003430A2. The very low defect density leads to a high yield during component fabrication, and the good layer thickness homogeneity leads to good, homogeneous transistor properties, for example threshold voltage. Therefore, the semiconductor substrate is highly suitable for the production of demanding electronic components.

The joining of a recess-containing surface to a carrier wafer combined with the utilization of surface diffusion and the efforts to minimize the surface energy and therefore the surface area itself is a completely new approach to multilayer wafer fabrication. Unlike known processes for producing SOI wafers, in the inventive technology it is not a single-crystalline layer with a predefined, constant thickness which is joined to the carrier wafer, but rather, the closed up layer is only formed after joining the donor wafer to the carrier wafer.

The present invention provides a relatively simple process with a reduced number of process steps as compared to WO03/003430 A2. The simpler process sequence means that the process is also more economical as well as easier to control, therefore offering fewer defect sources.

The process described in WO03/003430A2 allows a layer with a thickness which cannot be significantly less than 50 nm to be transferred, since the thickness of the transferred layer is limited by lithography. The process of the present invention allows significantly thinner layers to be transferred, since the atoms in the region of the surface provided with recesses, which are directly joined to the carrier wafer, are fixed at their respective positions by virtue of being joined to the carrier wafer and are therefore not available for surface diffusion. By contrast, atoms from the side walls and the base of the recesses can diffuse along the surface of the recesses toward the carrier wafer. Consequently, the previous openings of the recesses close up directly at the interface with the carrier wafer. During further heat treatment, the newly formed longish cavities seek to adopt a minimum energy state, i.e. a spherical form. Their width grows, whereas their depth shrinks. The arrangement and size of the longish recesses makes it possible to directly establish the thickness after separation, from a thickness of a few nanometers to several micrometers. Small diameters of the recesses and short distances between the recesses lead to a low thickness of the transferred layer, whereas large dimensions and greater distances lead to greater layer thicknesses.

In the process described in WO03/003430A2, by contrast, the atoms in the regions between the openings of the recesses, i.e. on the surface which is directly adjoined to the carrier wafer in accordance with the present invention, can also move freely and are therefore available for surface diffusion. Consequently, in WO03/003430A2, the edge between recess and surface also becomes rounded, which in turn means that the cavities are not closed up precisely at the surface, but rather at a certain depth. Therefore, as the recesses close up, shallow "depressions" are formed over the cavities formed therefrom, and these depressions are then filled again with material as the process continues, which leads to an increase in layer thickness.

Since the inventive process therefore allows very thin layers to be transferred, remachining steps used to reduce the layer thickness can be completely or partially eliminated. Therefore, the uniformity of the layer thickness (i.e. six times the standard deviation of the layer thickness) is substantially dependent only on the homogeneity of the diameters of the recesses and is therefore in the region of 5% or less.

The HF defect density is very strongly influenced by the layer thickness homogeneity, in particular in the case of very thin layers, for example those with a thickness of 10 nm or less. As described above, this applies in particular if a thicker layer is transferred and then the layer thickness is reduced. Since the present invention allows very thin layers to be transferred, there is generally no need to subsequently reduce the layer thickness. Moreover, since the transferred layers have a very good layer thickness homogeneity, the HF defect density, at 0.02/cm² or less, is very low in substrates produced according to the invention.

The process is suitable for transferring single-crystalline semiconductor layers to any desired carrier wafer, provided that significant surface diffusion can be achieved on the semiconductor material. The transfer can be assisted by applying a polycrystalline or amorphous layer, which is only a few atomic layers thick, to the carrier wafer 2 before the two wafers are joined in step b). This layer consists of a material which is preferably identical to the semiconductor material that is to be transferred or at least contains a constituent of the material that is to be transferred. The polycrystalline or amorphous layer may be applied, for example, by chemical vapor deposition (CVD).

The process according to the invention is suitable for producing a wide range of products:

A) SOI substrates are produced by the donor wafer 1 being a single-crystalline silicon wafer and the carrier wafer 2 being a wafer consisting of an electrically insulating material, such as glass or sapphire. The carrier wafer 2 may also be a semiconductor wafer, for example a polycrystalline or preferably single-crystalline silicon wafer, which carries an electrically insulating layer 9 (cf. FIGS. 6-10), for example a silicon oxide layer, on its surface.

B) GeOI substrates ("germanium on insulator") are produced in exactly the same way as SOI substrates as in A) above, except that a single-crystalline germanium wafer is used as a donor wafer 1.

C) A silicon carbide layer on any desired substrate is produced by using a donor wafer 1 which is a single-crystalline wafer of silicon carbide.

D) An SGOI substrate (silicon-germanium on insulator) is produced by using a donor wafer 1 which is a silicon wafer which, on at least one surface, carries a single-crystalline silicon-germanium layer of the composition $Si_xGe_{1-x}$ where x is greater than 0 and less than 1. The carrier wafer 2 may be a wafer of an electrically insulating material, or a semiconductor wafer, for example a polycrystalline or preferably single-crystalline silicon wafer which on its surface carries an electrically insulating layer 9 (FIGS. 6-10) such as a silicon oxide layer. After steps a) to d) of the process according to the invention have been carried out, it is additionally possible for a thin, strained silicon layer to be deposited on the SGOI substrate.

E) To produce an sSOI substrate (strained silicon on insulator), first of all a single-crystalline, stress-free silicon-germanium layer of the composition $Si_xGe_{1-x}$ where x is greater than 0 and less than 1, is deposited on a silicon wafer. Then, a thin, strained silicon layer is deposited on the silicon-germanium layer, and then in step a) recesses 3 are produced in the strained silicon layer by lithography and trench etching or anodic etching. The donor wafer 1 which has been prepared in this way is joined to an electrically insulating layer 9 of a carrier wafer 2 (for example the oxidized surface of a silicon wafer) in step b). The joined wafers are then subjected to steps c) and d) of the process according to the invention.

EXAMPLES

Example 1

This example relates to FIGS. 6-10. Periodic regular recesses 3 with a round cross section were produced by lithography and ion beam etching in accordance with prior art in the surface of a silicon wafer 1. The depth of the recesses was 3.5 µm, their diameter was 0.4 µm and the distance between centers of the recesses was 0.8 µm. In a further step, the silicon surface provided with recesses was joined (bonded) to a silicon wafer 2 carrying a silicon oxide layer 9. A commercially available bonder was used for this purpose. The wafers which had been joined to one another were subjected to a heat treatment lasting a total of 10 h at a maximum temperature of 1100° C. The treatment was carried out under an argon atmosphere at a pressure of 0.1 MPa. This heat treatment on the one hand increased the strength of the joint between the two wafers, and on the other hand caused the recesses 3 to close up directly at the interface 4 with the silicon oxide layer 9 on the silicon wafer 2, forming a thin single-crystal silicon layer 7. As the heat treatment continued, the newly formed cavities 6 fused together so as to form a continuous cavity between the newly formed silicon layer 8 and the remainder 5 of the silicon wafer which was previously provided with recesses. The thin single-crystalline silicon layer 8 was then joined only to the oxide layer 9.

Example 2

Periodic regular recesses with a round cross section were produced by lithography and ion beam etching in accordance with prior art in the surface of a conventional silicon wafer coated with silicon-germanium (thickness of the silicon-germanium layer approximately 4 µm). The depth of the recesses was 3.5 µm, their diameter was 0.4 µm, and the distance between centers of the recesses was 0.8 µm. In a further step, the silicon-germanium surface which had been provided with recesses was joined (bonded) to a silicon wafer with an oxidized surface. A commercially available bonder was used for this purpose. The pair of wafers which had been joined to one another was then subjected to a heat treatment lasting a total of 10 h at a maximum temperature of 1100° C. The pressure was 0.1 MPa, and the atmospheric gas selected was Ar. This heat treatment on the one hand increased the strength of the joint between the two wafers and on the other hand caused the recesses to close up directly at the interface with the oxidized silicon wafer, forming a thin single-crystalline silicon-germanium layer. As the heat treatment continued, the newly formed cavities fused together so as to form a continuous cavity between the newly formed silicon-germanium layer and the silicon wafer which was previously provided with recesses. The thin single-crystalline silicon-germanium layer was then joined only to the oxide layer, resulting in an SGOI substrate.

Example 3

First, a strained silicon layer was deposited on a silicon wafer coated with a relaxed silicon-germanium layer. Periodically regular recesses with a round cross section were produced by lithography and ion beam etching in the surface of the strained silicon layer in accordance with prior art. The depth of the recesses was 3.5 µm, their diameter was 0.4 µm and the distance between centers of the recesses was 0.8 µm. In a further step, the strained silicon surface provided with recesses was joined (bonded) to a silicon wafer with an oxidized surface. A commercially available bonder was used for this purpose. The pair of wafers which had been joined to one another was then subjected to a heat treatment lasting a total of 10 h at a maximum temperature of 1100° C. The pressure was 0.1 MPa and the atmospheric gas selected was Ar. This heat treatment on the one hand increased the strength of the joint between the two wafers and on the other hand caused the recesses to close up directly at the interface with the oxidized silicon wafer, forming a thin, single-crystalline, strained silicon layer. As the heat treatment continued, the cavities formed from the recesses fused together, so as to form one continuous cavity between a newly formed silicon layer and the strained silicon layer which was previously provided with recesses. The thin, single-crystalline, strained silicon layer was now joined only to the oxide layer, resulting in an sSOI substrate.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A semiconductor substrate, comprising a carrier wafer and a joined layer comprising single-crystalline semiconductor material, wherein the joined layer has a thickness of 100 nm or less, has a layer thickness uniformity of 5% or less, and an HF defect density of $0.02/cm^2$ or less.

2. The semiconductor substrate of claim 1, wherein the joined layer is one of silicon, strained silicon, silicon-germanium, germanium, or silicon carbide.

3. The semiconductor substrate of claim 1, wherein the carrier wafer is a silicon wafer with an oxide layer.

4. The semiconductor substrate of claim 1, wherein the joined layer of single-crystalline semiconductor material has a thickness of 80 nm or less.

5. The semiconductor substrate of claim 4, wherein the joined layer of single-crystalline semiconductor material has a thickness of 50 nm or less.

6. The semiconductor substrate of claim 5, wherein the joined layer of single-crystalline semiconductor material has a thickness of 20 nm or less.

7. The semiconductor substance of claim 1 wherein the joined layer is a semiconductor layer of a donor wafer, the semiconductor layer having had recesses on a surface thereof which is joined to a surface of the carrier wafer, the carrier wafer and joined donor wafer are thermally treated to close up the recesses at said semiconductor layer surface, forming a single crystal joined layer, and the carrier wafer and single crystal joined layer are separated along the plane of closed recesses, wherein the thickness and thickness uniformity of the joined layer are measured following joining but prior to further processing.

8. The semiconductor substance of claim 7 wherein the joined layer has a thickness of 20 nm or less.

* * * * *